United States Patent [19]

Herrick

[11] Patent Number: 4,727,633
[45] Date of Patent: Mar. 1, 1988

[54] METHOD OF SECURING METALLIC MEMBERS TOGETHER

[75] Inventor: Geoffrey C. Herrick, Aloha, Oreg.

[73] Assignee: Tektronix, Inc., Beaverton, Oreg.

[21] Appl. No.: 910,321

[22] Filed: Sep. 22, 1986

Related U.S. Application Data

[63] Continuation of Ser. No. 763,497, Aug. 8, 1985, abandoned.

[51] Int. Cl.⁴ .................. B23K 31/02; B23K 35/28
[52] U.S. Cl. ..................... 228/122; 228/180.2; 228/263.18; 228/263.21; 29/827; 29/840
[58] Field of Search .......... 228/122, 180.1, 180.2, 228/263.21, 263.18; 156/901; 427/97; 29/827, 840, 860

[56] References Cited

U.S. PATENT DOCUMENTS

| | | | |
|---|---|---|---|
| 2,133,492 | 10/1938 | Vatter | 228/263.12 |
| 3,862,488 | 1/1975 | Pessell et al. | 228/122 |
| 3,865,970 | 2/1975 | Vrijssen | 228/122 |
| 3,923,551 | 12/1975 | Purdy | 228/122 |
| 3,926,360 | 12/1975 | Moister, Jr. | 228/180.2 |
| 3,929,426 | 12/1975 | Blust et al. | 228/122 |
| 4,000,054 | 12/1976 | Marcantonio | 204/192.21 |
| 4,016,050 | 4/1977 | Lesh et al. | 204/15 |
| 4,054,484 | 10/1977 | Lesh et al. | 156/652 |
| 4,139,881 | 2/1979 | Shimizu et al. | 228/180.1 |
| 4,312,897 | 1/1982 | Reimann | 156/901 |
| 4,332,341 | 6/1982 | Minetti | 228/180.2 |
| 4,352,449 | 10/1982 | Hall et al. | 228/123 |
| 4,373,259 | 2/1983 | Motsch | 228/180.2 |
| 4,423,401 | 12/1983 | Mueller | 337/107 |

FOREIGN PATENT DOCUMENTS 14505  5/1973  Japan ..................... 228/122

OTHER PUBLICATIONS

IBM Technical Disclosure, vol. 15, No. 5, Oct. 1972.

Primary Examiner—Fred Silverberg
Assistant Examiner—Samuel M. Heinrich
Attorney, Agent, or Firm—Francis I. Gray

[57] ABSTRACT

Two metallic members are connected together over a defined area of respective surfaces of the members by providing at least one layer of metal on at least one of the surfaces. The or each layer of metal has at least one elementary component and is of essentially uniform composition over the defined area, and is of essentially uniform thickness over the defined area. The two surfaces are brought into confronting, contacting relationship, and heat is applied to cause the metal of the or each layer to melt, whereby the members are bonded together by an alloy having a melting point in the range from about 500 degrees C to about 900 degrees C.

5 Claims, 4 Drawing Figures

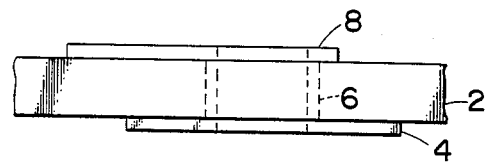
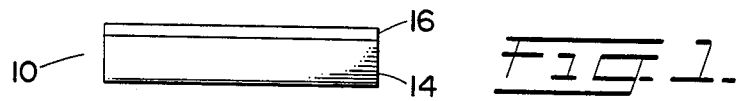
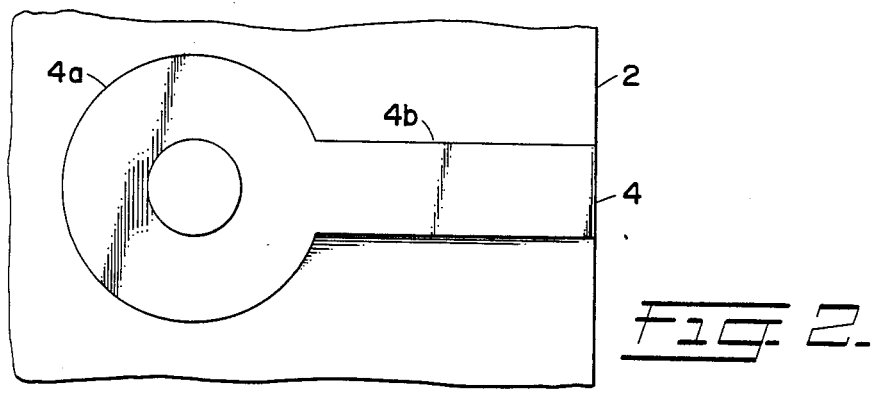
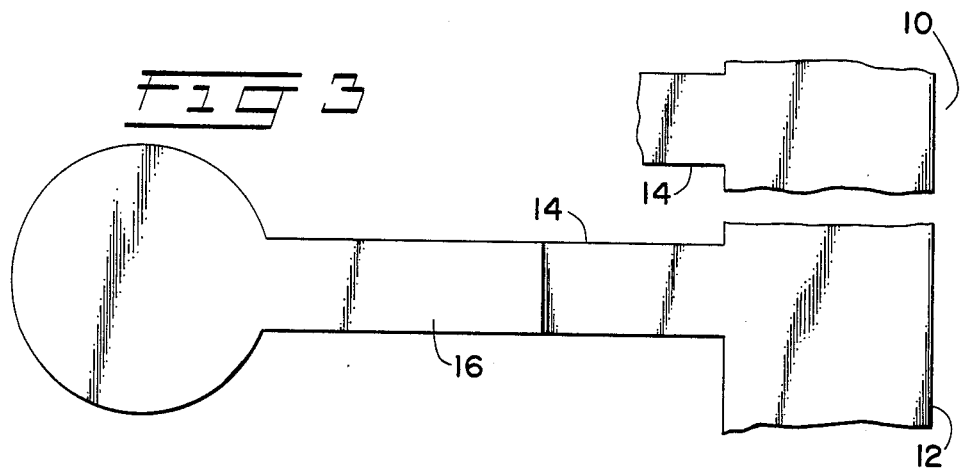
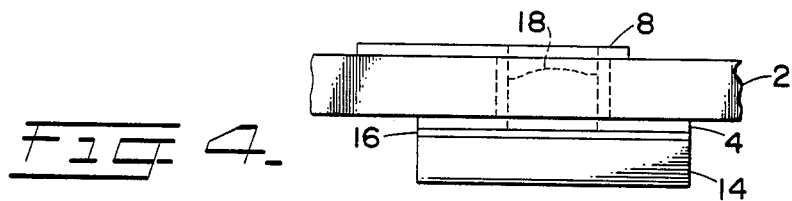

METHOD OF SECURING METALLIC MEMBERS TOGETHER

This is a continuation of application Ser. No. 763,407 filed 8/8/85 and now abandoned.

This invention relates to a method of securing metallic members together.

BACKGROUND OF THE INVENTION

In the manufacture of hybrid circuits, it is frequently necessary or desirable to establish a conductive bond between two metallic members. For example, it may be desired to establish such a bond in order to provide a conductive connection between a layer of metallization that has been deposited by thin-film evaporation techniques on a ceramic substrate to form a conductor run, and a metallic member that constitutes a lead for connecting the conductor run to another circuit element.

It is conventional to use a solder preform in order to provide a conductive bond between a metallic lead and a thin-film conductor run on a ceramic substrate. However, use of a preform is subject to the disadvantage that it requires three components (substrate, lead and preform) to be brought into alignment. Moreover, solders in general are subject to the disadvantage that their low melting points (below about 500 degrees C.) require that subsequent processing of the hybrid circuit be carried out at relatively low temperatures in order to avoid degrading the bond.

In the manufacture of a hybrid circuit, it is conventional to secure a lid to the substrate in order to isolate the monolithic integrated circuit chip mounted on the substrate from the environment in which the hybrid might be used. Generally, the lid is secured to the substrate by soldering. In order to isolate the IC chip effectively, throughholes in the substrate must be sealed, and it has been conventional hitherto to use a filling of glass or plastic material to seal such throughholes. However, at temperatures used for soldering the lid to the substrate some plastics and glasses have a negative temperature coefficient of expansion and consequently tensile stresses may be created in the substrate material. In the case of a ceramic substrate material this may be a disadvantage, because ceramics, although strong in compression, are relatively weak in tension.

SUMMARY OF THE INVENTION

In a preferred embodiment of the present invention, first and second metallic members are secured together over a defined area of respective surfaces of the members by providing at least one layer of metal on at least one of the surfaces, the or each layer of metal having at least one elementary component, being of essentially uniform composition over the defined area, and being of essentially uniform thickness over the defined area. The two members are brought into confronting relationship, and heat and pressure are applied to cause the metal of the or each layer to melt, whereby the members are bonded together by an alloy having a melting point in the range from about 500 degrees C. to about 900 degrees C.

In the preferred embodiment, one of the metallic members is a metallic coating on a ceramic substrate, and the substrate is formed with a plated through-hole that opens at one end within the defined area of the metallic coating. The molten alloy flows into the hole and seals the hole on solidification.

It is preferred that there be two elementary metallic components, i.e. components that are metallic elements, and that these components are silver and copper in proportions such that the composition of the alloy is close to that of the eutectic alloy of silver and copper.

BRIEF DESCRIPTION OF THE DRAWINGS

For a better understanding of the invention, and to show how the same may be carried into effect, reference will now be made, by way of example, to the accompanying drawings in which:

FIG. 1 is an enlarged partial sectional view of a hybrid circuit substrate and a leadframe, FIG. 2 is an enlarged partial bottom plan view of the substrate, FIG. 3 is an enlarged partial top plan view of the leadframe, and FIG. 4 is a view similar to FIG. 1 of the substrate and leadframe when bonded together.

In the drawings, no attempt has been made to depict relative dimensions accurately. Rather, relative dimensions have been distorted where necessary in order to aid in understanding the invention.

DETAILED DESCRIPTION

FIG. 1 illustrates a hybrid circuit substrate 2 that is formed with a metallic coating that partially covers the substrate. The substrate is, for example, a high alumina ceramic. The coating may be a multiple layer coating comprising base layers of titanium (40 nm), palladium (80 nm) and gold (100 nm) deposited sequentially by thin-film evaporation and a further layer of gold (6 $\mu$m) deposited by electrolytic plating. The layer of titanium is used because it adheres well to the ceramic material. The evaporated and plated layers of gold are used because alloys of copper and silver adhere well to gold, the evaporated layer being used in order to facilitate adhesion of the plated layer. The layer of palladium is used as a barrier to prevent diffusion of titanium into the gold layers. The base layers are deposited over the entire exposed surface of the substrate, including the interior surface of a through-hole 6, and then areas that are not to receive the gold plating are masked. The gold plating is then deposited electrolytically. The masking material is removed, and the evaporated metal that is thus exposed is removed by etching. It is not necessary to mask the plated gold at this point, because the plated gold layer is so much thicker than the evaporated layers. The result is that the substrate 2 is provided with a multiple layer metallization over well-defined areas, such as a lower conductor run 4, the interior of the through-hole 6 and an upper conductor run 8. The metallization through the interior of the through-hole provides an electrical connection between the conductor runs 4 and 8. Typically, a contact pad of a monolithic integrated circuit chip (not shown) will be connected to the conductor run 8 by wire bonding or other means.

As shown in FIG. 2, the lower conductor run 4 comprises an annular portion 4a concentrically surrounding the lower end of the through-hole 6, and a strip portion 4b extending from the annular portion 4a to the periphery of the substrate 2. The structure of the hybrid circuit is more fully disclosed in U.S. Pat. No. 4,626,805 issued Dec. 2, 1986 to Keith E. Jones entitled "Surface Mountable Microwave IC Package."

Also shown in FIG. 1 is a portion of a leadframe 10. The leadframe 10 is made of a low expansion alloy, such as Kovar or Alloy 42, and comprises a frame portion 12 (FIG. 3), that is typically of rectangular form, and numerous leads 14 that extend from the frame portion 12 into the interior of the opening defined by the frame portion. The frame portion is used to hold the leads 14 in predetermined relative positions until they are attached to the substrate 2, whereupon the frame portion is severed from the leads leaving the leads extending in cantilever fashion from the substrate. A leadframe is generally made from a tape of the selected low expansion alloy. The leadframe may be made by stamping, in which case the leadframe is severed from the tape simultaneously with the forming of the leads. Alternatively, the leads may be defined by chemical etching and the individual leadframes separated from the tape by a mechanical cutting operation. The mechanical cutting operation may take place before or after the etching operation.

Each lead 14 of the leadframe shown in FIG. 3 is provided with a coating layer 16 over the area of the lead that is to be bonded to the substrate 2. The coating comprises silver and copper in approximately the proportions of the eutectic alloy of silver and copper, i.e. approximately 1 part by weight of copper to 2.174 parts by weight of silver. In order to bond the leadframe 10 to the substrate 2, the coated surface of the leadframe and the lower surface of the substrate are brought into confronting relationship, as shown in FIG. 1, with the leads 14 in registration with the conductor runs 4. The leads 14 are brought into contact with the conductor runs 4, and by application of pressure and heat the coating 16 melts and, upon subsequent cooling, forms a firm metallurgical bond between the leadframe and the conductor runs 4. Some of the molten metal flows into the through-hole 6, as shown at 18 in FIG. 4, and consequently a good electrically conductive connection is provided between the lead 14 and the upper conductor run 8, and the through-hole 6 is hermetically sealed.

There are numerous ways of providing the coating layer 16 on the leadframe 10. For example, a pre-formed leadframe may be masked so as to expose only the areas that are to receive the coating and the coating may then be deposited either by sequential plating of silver and copper or by plating of the binary alloy. It will be understood by those skilled in the art that it is more difficult to control plating of the binary alloy so as to provide the desired composition; and that even if the components of the alloy are plated in succession, upon application of heat and pressure the composite layer will melt at substantially the same temperature as the binary alloy. Alternatively, prior to stamping the leadframe from the tape of low expansion alloy, a tape of the eutectic alloy may be clad to the tape of low expansion alloy by feeding the two tapes between cladding rolls. Thereafter, the leadframe is defined by stamping or etching the composite tape, and the cladding of eutectic alloy over the frame portion 12 and the outer ends of the leads 14 is removed by selective etching, so as to leave the coating 16.

The eutectic alloy of copper and silver melts at about 779 degrees C. It would, however, be possible to use a composition that differs from that of the eutectic alloy such that the melting point is as high as 900 degrees C. It is, however, necessary that the melting point of the alloy that is used be at least 500 degrees C. in order to avoid degradation of the metallurgical bond and the hermetic seal during subsequent processing of the hybrid circuit.

By use of a relatively high temperature braze, instead of a lower temperature braze or solder, to provide the metallurgical bond between the plated gold layer and the leadframe, a further advantage is obtained that is particularly applicable to the described embodiment of the invention. Thus, at all temperatures below the melting point of the alloy the contraction of the alloy insures that hoop stresses in the ceramic material surrounding the through-hole 6 are compressive.

It will be appreciated that the present invention is not restricted to the particular method that has been described, and that variations may be made therein without departing from the scope of the invention as defined in the appended claims, and equivalents thereof. For example, other alloys than the silver/copper eutectic may be used to form the braze, and the coating layer 16 may be provided over the conductor run 4 of the substrate instead of on the leadframe. Moreover, one component of the alloy might be deposited on the leadframe and the other on the substrate, although a higher pressure would be needed to force the layers together and melt than when the two components are both deposited either on the leadframe or on the substrate. The invention is not restricted to use of binary alloys.

I claim:

1. A method of securing first and second metallic members together over a defined area of respective surfaces of said members, the first metallic member being a multiple layer metallic coating on a dielectric substrate, comprising:
    (a) coating a layer of metal on selected areas of the surface of the second metallic member, the layer of metal being silver and copper having a melting point in the range of 500 degrees C. to about 900 degrees C., being of essentially uniform composition over said area, and being of essentially uniform thickness over said defined area;
    (b) bringing said surfaces into confronting, contacting relationship; and
    (c) brazing the first and second metallic members together.

2. A method according to claim 1 wherein said dielectric substrate is made of a ceramic material and is formed within said area with a hole, the hole being metallized by the multiple layer metallic coating and the second metallic member covering the hole such that, when the layer of metal melts during the brazing step, a portion of the metal flows into the hole to provide an hermetic seal.

3. A method according to claim 2 wherein the layer of metal of step (a) comprises sequentially two layers of metal, the two layers being copper and silver and each being of essentially uniform thickness over said area and of essentially uniform thickness over said area.

4. A method according to claim 2 wherein the layer of metal comprises a eutectic alloy of copper and silver.

5. A method for bonding a leadframe to a thin film hybrid substrate having throughholes comprising the steps of:
    evaporating consecutive layers of titanium, palladium and gold onto the substrate including the throughholes;
    masking the resulting metallized substrate and plating gold on the unmasked regions to form conductors having an annular portion around the throughholes;
    etching away the metallization, leaving only the conductors;

contacting the leadframe having leads with a circular portion corresponding to the annular portion of the conductors, the leads being coated with a eutectic alloy of silver and copper, to the substrate such that the leads are in registration with and confront the conductors; and brazing the leads to the conductors such that a portion of the eutectic alloy flows into the through-holes to provide an hermetic seal.

* * * * *